United States Patent [19]

Kraft et al.

[11] Patent Number: 4,578,782
[45] Date of Patent: Mar. 25, 1986

[54] ASYNCHRONOUS MEMORY REFRESH ARBITRATION CIRCUIT

[75] Inventors: Douglas R. Kraft, Austin; Harry F. Elrod, Ft. Worth, both of Tex.

[73] Assignee: Motorola, Inc., Schaumburg, Ill.

[21] Appl. No.: 526,736

[22] Filed: Aug. 26, 1983

[51] Int. Cl.[4] ............................. G11C 7/00; G06F 9/46
[52] U.S. Cl. ...................................... 365/222; 364/900
[58] Field of Search ............... 365/222, 230; 364/200, 364/900

[56] References Cited

U.S. PATENT DOCUMENTS 4,339,808  7/1982  North ................................. 364/900
4,406,013  9/1983  Reese et al. ..................... 365/222 X

*Primary Examiner*—Joseph A. Popek
*Attorney, Agent, or Firm*—Anthony J. Sarli, Jr.; Jeffrey Van Myers; Robert L. King

[57] ABSTRACT

An arbitration circuit for asynchronously arbitrating between refreshing memory and performing a non-refresh memory cycle in a memory system having memory cycle generating circuitry. Arbitration circuitry comprising logic circuitry, a clocked storage device and delay circuits which are coupled to memory cycle generating circuitry for performing an arbitration decision for a memory during an immediately preceding memory cycle. The arbitration circuitry time overlaps an arbitration operation with a memory cycle operation during a first memory cycle, thereby improving data rate for an adjacent second memory cycle.

7 Claims, 2 Drawing Figures

4,578,782

ASYNCHRONOUS MEMORY REFRESH ARBITRATION CIRCUIT

TECHNICAL FIELD

This invention relates generally to memory circuits and, more particularly, to memory circuits having an arbitration circuit for memory refresh.

BACKGROUND ART

A dynamic memory typically has four basic memory cycles including a read, a write, a read-modify-write and a refresh cycle. An oscillator circuit is commonly used to provide a refresh request signal at a frequency which is adequate to refresh the memory. A refresh request signal for refreshing memory may occur asynchronously with respect to the time during which a non-refresh cycle is requested. Upon receiving the refresh request signal, the memory circuit must be capable of deciding whether to perform a memory cycle such as a read or a write or to refresh the memory. In order to arbitrate between refresh cycles and memory cycles, a storage device is typically needed to store the decision. However, due to the asynchronous nature of the signals, the set-up time of the storage device may be violated causing the storage device to enter an indeterminate or metastable state. Operation of a storage device in the metastable state results in the storage device oscillating or becoming otherwise unfunctional for a period of time depending upon the type of storage device. Therefore, a time delay is designed into the circuit to provide time for the storage device to settle. Previous memory circuits have utilized arbiters which require the arbitration time to be at the beginning of each memory cycle. As a result, during the beginning of each memory cycle, the memory circuit is not being accessed and thus not efficiently utilized.

SUMMARY OF THE INVENTION

It is an object of the present invention to provide an improved memory refresh arbitration circuit.

Another object of the present invention is to provide an improved memory circuit which provides refresh arbitration simultaneously with cycle generation of the memory.

A further object of the present invention is to provide an improved memory circuit having time overlapping refresh arbitration and cycle generation.

Yet another object of the present invention is to provide a memory refresh arbitration circuit with an improved data rate.

In carrying out the above and other objects, there is provided, in one form, an asynchronous memory refresh arbitration circuit for arbitrating between refreshing memory or performing a predetermined memory cycle in a memory system. Arbitration means are provided for receiving either a refresh request signal or a non-refresh cycle request signal, or receiving both request signals substantially simultaneously and arbitrating during an active memory cycle whether or not to refresh the memory or to perform a predetermined memory cycle. By time overlapping refresh arbitration and memory cycle generation, typically each memory cycle may be shortened in time and data rate of the memory system is improved.

The above and other objects, features and advantages of the present invention will be more clearly understood from the following detailed description taken in conjunction with the accompanying drawings.

DESCRIPTION OF THE PREFERRED EMBODIMENT

Figure 1:
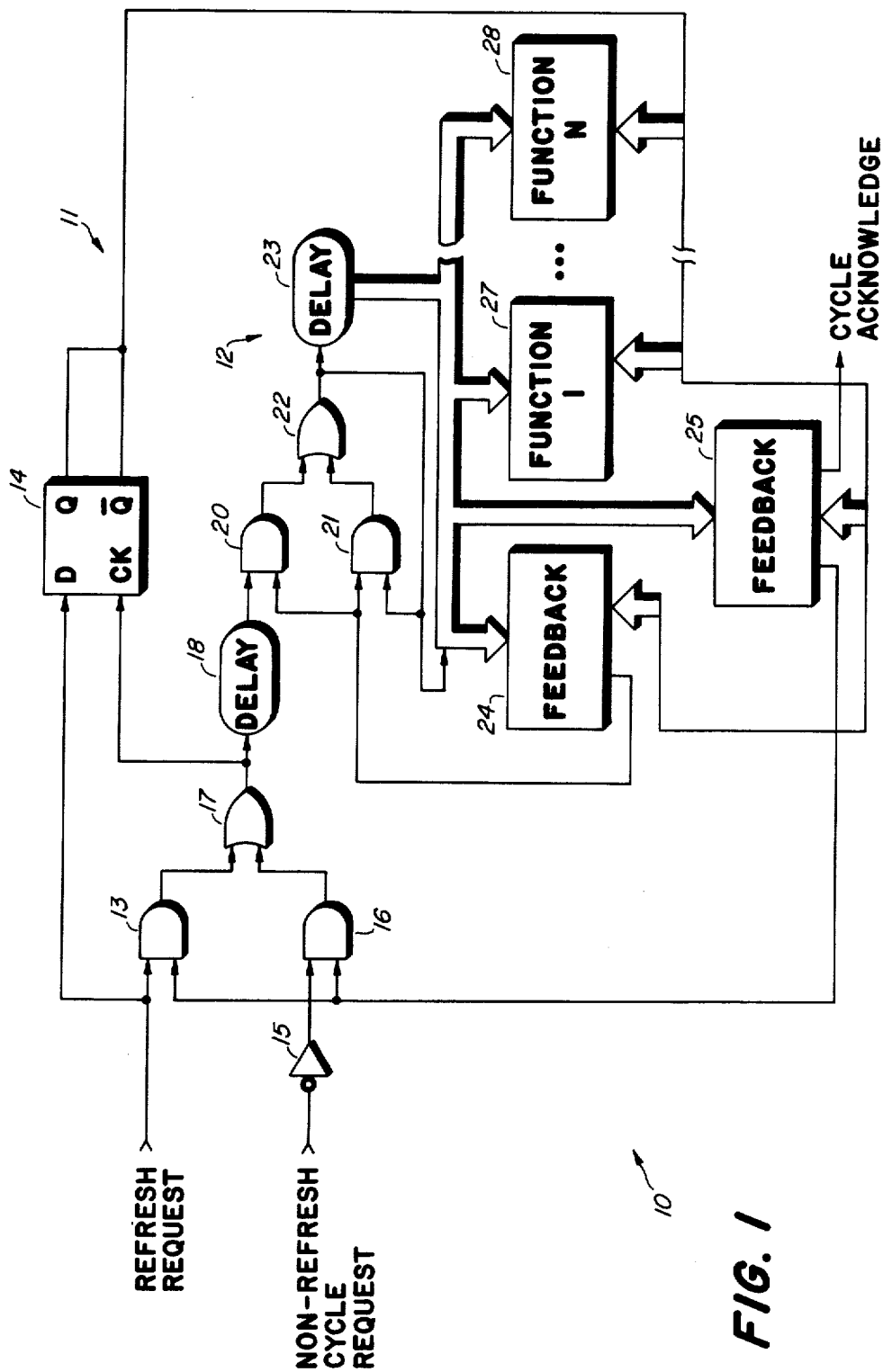
FIG. 1 illustrates in schematic form an asynchronous memory refresh arbitration circuit.

Shown in FIG. 1 is an asynchronous memory refresh circuit 10 having an arbitration circuitry portion 11 and a cycle circuitry portion 12. Generally, arbitration circuitry portion 11 comprises elements 13–18 and 20–25 and cycle circuitry portion 12 comprises elements 20–25, 27 and 28 so that some elements are common to both portions. In arbitration circuitry portion 11, an AND gate 13 has a first input connected to a first input of a flip flop circuit 14 labeled "D" for receiving a refresh request control signal. An inverter 15 has an input coupled to a non-refresh cycle request control signal and an output coupled to a first input of an AND gate 16. AND gate 16 has a second input connected to a second input of AND gate 13. An output of AND gate 13 is connected to a first input of an OR gate 17. An output of AND gate 16 is connected to a second input of OR gate 17. An output of OR gate 17 is connected to both a second input of flip flop circuit 14 labeled "CK" and an input of a delay circuit 18. An AND gate 20 having a first input connected to the output of delay circuit 18 and a second input connected to a first input of an AND gate 21. An output of AND gate 20 is connected to a first input of an OR gate 22, and an output of AND gate 21 is connected to a second input of OR gate 22. An output of OR gate 22 is connected to both an input of a delay circuit 23 and a second input of AND gate 21. The second input of AND gate 21 and the output of OR gate 22 are also connected to a first input of a feedback circuit 24, to a first input of a feedback circuit 25, and to first inputs of a plurality of predetermined N function circuits, where N is an integer, depending upon the particular application. In the illustrated embodiment of FIG. 1, the plurality of N function circuits are illustrated by a first function circuit 27 and an Nth function circuit 28. A plurality of cycle signals of varying predetermined frequencies are provided from a plurality of outputs of delay circuit 23 and are connected to a plurality of second inputs of both first feedback circuit 24 and second feedback circuit 25, and to a plurality of second inputs of the N function circuits such as function circuit 27 and function circuit 28, depending upon the application. First feedback circuit 24 has a third and a fourth input connected to the first and second outputs, Q and $\bar{Q}$, of flip flop circuit 14, respectively, and an output connected to both the first input of AND gate 21 and the second input of AND gate 20. Second feedback circuit 25 has a third and a fourth input connected to the first and second outputs, Q and $\bar{Q}$, of flip flop circuit 14, respectively. Function circuits 27 and 28 each have third and fourth inputs connected to the first and second outputs, Q and $\bar{Q}$, of flip flop circuit 14, respectively. A first output of second feedback circuit 25 is connected to both the second input of AND gate 16 and the second input of AND gate 13, and a second output of second feedback circuit 25 provides a cycle acknowledge signal.

In operation, assume that no memory cycles are running and both delay circuits 18 and 23 have settled out to normal states. Assume that the second inputs of AND gates 13 and 16 are enabled by a logic high signal from the output of second feedback circuit 25. Also, assume that the second input of AND gate 20 and the first input of AND gate 21 are enabled from the output of first feedback circuit 24. The presence of a non-refresh cycle request signal may represent a read, a write, a read-modify-write or any other type of memory cycle request other than a refresh request. The presence of a refresh request signal represents a request to refresh the memory. When both a refresh request signal and a non-refresh cycle request signal occur simultaneously, or near simultaneously, memory refresh circuit 10 functions to arbitrate which function is executed. AND gates 13 and 16 and OR gate 17 function to provide a rising clock edge at the output of OR gate 17 when either a refresh request signal or a non-refresh cycle request signal is received. For purposes of illustration only, assume that a non-refresh cycle request signal is received as is indicated by a low logic level signal in FIG. 2 and that no refresh request signal is received. Although both a non-refresh cycle request and a refresh request signal are not present at the same time, an arbitration time frame exists during which an arbitration is performed. Further, arbitration circuitry portion 11 is integrally functional with cycle circuitry portion 12 to provide a memory cycle. The output of OR gate 17 becomes a rising clock edge which clocks flip flop circuit 14 which functions as a clocked storage circuit. The first input of flip flop circuit 14 is at a determined state (logic low) since there is no refresh request signal. Therefore, the set-up time of flip flop circuit 14 is not violated in this example and flip flop circuit 14 will settle within its predetermined propagation delay time. The delay of delay circuit 18 is utilized for other purposes to be described below. The rising clock edge at the output of OR gate 17 is delayed by delay circuit 18 before being coupled to the first input of AND gate 20 as a memory cycle initiate signal. The amount of delay of delay circuit 18 allows the output of flip flop circuit 14 to settle before being used to indicate whether there is a non-refresh memory cycle or a refresh cycle to be performed by the plurality of N function circuits. The rising clock edge from the output of OR gate 17 indicates that a memory cycle is to be performed by cycle circuitry portion 12 and propagates via delay circuit 18 through AND gate 20 and OR gate 22 since gates 20 and 21 are enabled by feedback circuit 24. The output of OR gate 22 is latched by AND gate 21 as long as feedback circuit 24 keeps AND gate 21 enabled. Delay circuit 23 provides a timing control function for first and second feedback circuits 24 and 25 by holding the rising clock edge for a predetermined amount of time before coupling a plurality of delayed cycle signals (not shown) of predetermined frequencies to the plurality of N function circuits, including function circuits 27 and 28. Predetermined delayed cycle signals and combinations thereof are each assigned to correspond to a predetermined memory cycle function from delay circuit 23. Function circuits 27 and 28 generate various timing signals (not shown) for other purposes depending upon what type of memory cycle function exists. Feedback circuits 25 and 24 provide feedback signals which are coupled to predetermined inputs of AND gates 13 and 16 and AND gates 20 and 21, respectively, to enable AND gates 13, 16, 20 and 21 at predetermined time periods depending upon the type of cycle. Feedback circuit 25 provides an output signal before feedback circuit 24 provides an output signal thereby allowing arbitration circuitry portion 11 to begin arbitrating the next cycle request before the present memory cycle is completed by cycle circuitry portion 12. During a memory cycle, feedback circuit 24 disables AND gate 21 which unlatches the output of OR gate 22 in response to a delayed high logic level output of delay circuit 23 and the outputs of flip flop circuit 14. Feedback circuit 24 also enables AND gates 20 and 21 after the memory cycle is completed in response to delay circuit 23. Feedback circuit 25 enables AND gates 13 and 16 a predetermined amount of time after the present memory cycle has begun in response to delay circuit 23. This indicates that the beginning of another arbitration may begin for a pending cycle, if any.

For the purpose of illustration only, assume that no non-refresh cycle request signal is present and a refresh request signal occurs. Again, although both a non-refresh cycle request and a refresh request are not present at the same time, an arbitration time frame exists during which an arbitration is performed. Similarly, arbitration circuitry portion 11 is integrally functional with cycle circuitry portion 12 to provide a memory refresh cycle. The refresh request signal creates a rising clock edge at the output of OR gate 17 which clocks flip flop circuit 14. Since a high logic level signal is present at the first or D input of flip flop circuit 14, a high logic level is clocked to the Q output of flip flop circuit 14. The rising clock edge is delayed by delay circuit 18. A minimum amount of time delay through AND gate 13 and OR gate 17 is required to guarantee that by the time flip flop circuit 14 clocks, the set-up time of flip flop circuit 14 has been established. In a similar manner as described above, delay circuit 18 holds the rising clock edge for a predetermined amount of time before the rising clock edge is coupled to the first input of AND gate 20. A rising clock edge results at the output of OR gate 22 and is delayed by delay circuit 23 before being coupled to the plurality of N function circuits which effect a refresh of memory. Feedback circuits 24 and 25 function in an analogous manner during a refresh request operation as described above for a non-refresh cycle request operation.

When both a non-refresh cycle request signal and a refresh request signal occur simultaneously or near simultaneously, arbitration is again required during an arbitration time frame. However, in this example flip flop circuit 14 may enter a metastable condition due to the presence of two request signals. Therefore, delay circuit 18 is utilized to guarantee that flip flop circuit 14 is settled. A high logic level signal is coupled to the first or D input of flip flop circuit 14 and a rising clock edge appears at the output of OR gate 17. Typically, both a set-up time having a duration of at least three nanoseconds prior to the reception of the rising clock edge and a hold time having a duration of at least two nanoseconds after the reception of the rising clock edge are needed to establish proper functioning of flip flop circuit 14. If the set-up time or hold time of flip flop circuit 14 is violated, flip flop circuit 14 may enter a metastable region of operation which is indeterminate resulting in an invalid cycle for the memory. Therefore, a flip flop with a known metastable characteristic is used in conjunction with delay means 18 to insure that the output of flip flop 14 is valid before a rising clock edge is coupled to the first input of AND gate 20 and before the cycle circuitry operation occurs. Typical metastable settling times of flip flops vary from device to device and the amount of delay of delay means 18 must be designed accordingly to insure an adequate settling time for a specific device. During the settling time of flip flop circuit 14, AND gates 20 and 21 are gated with a low logic level by the output of delay circuit 18. Feedback circuit 24 enables the second input of AND gate 20 and the first input of AND gate 21 when the previous cycle is completed. When a rising clock edge appears at the output of delay circuit 18, a rising clock edge is coupled to the input of delay circuit 23 via AND gate 20 and OR gate 22. Delay circuit 23 then couples an output to the plurality of N function circuits, such as circuits 27 and 28. AND gate 21 provides a latching function by forcing the output of OR gate 22 to remain at a logic high level until feedback circuit 24 disables AND gate 21.

Figure 2:
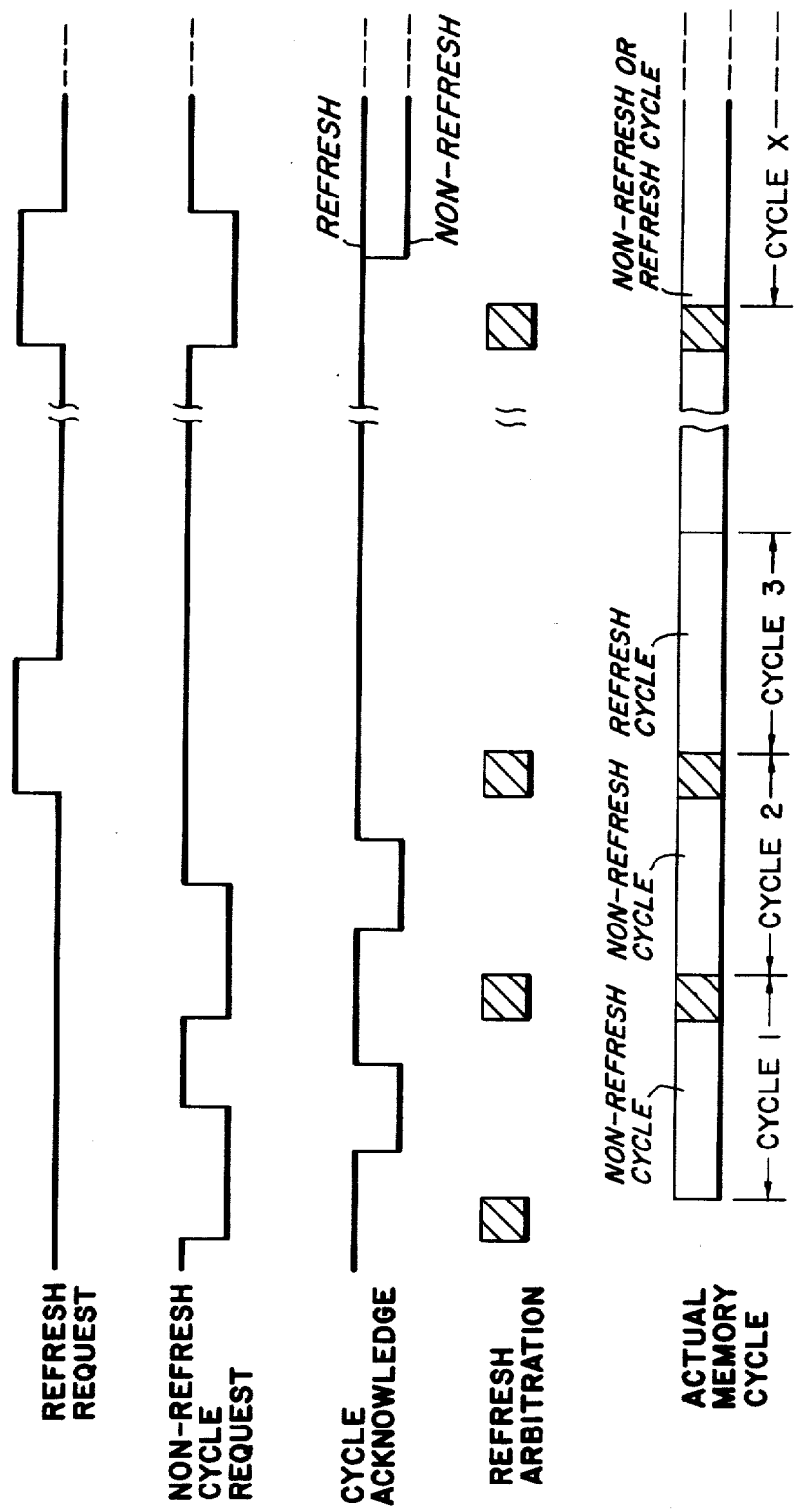
FIG. 2 illustrates in graphical form signals associated with the refresh arbitration circuit of FIG. 1.

The operation of arbitration circuit 10 may be further illustrated by referring to the timing signals illustrated in FIG. 2. The occurrence of a non-refresh cycle request signal is shown as a low logic level signal which is inverted by inverter circuit 15 as a high logic level signal to AND gate 16. Although this convention of cycle request logic level is typical, it should be obvious that a non-refresh cycle request signal of opposite logic state may be coupled directly to the first input of AND gate 16. Shown in FIG. 2 are refresh request and non-refresh cycle request signals during X memory cycles including three initial cycles followed by an arbitrary number of cycles and concluded with an Xth cycle, where X is an integer. During the first and second cycles, only a non-refresh cycle request signal indicated as a low logic level is present. During the illustrated third cycle, both a refresh request and a non-refresh cycle request signal are received and another arbitration occurs. A refresh arbitration time frame is shown in the form of a box with cross hatching illustrating the time frame in which an arbitration decision is made. Note that the first memory cycle (cycle 1) is longer than cycle 2, cycle 3 and cycle X. This is because initially time must be dedicated for arbitrating. However, for all subsequent adjacent memory cycles, the arbitration associated with any particular cycle occurs at the end of the previous cycle which enhances the speed of the data throughput thereby rendering a substantial advantage over the prior art. Therefore, an arbitration for an advancing cycle is always time overlapped with a presently occurring cycle. By separating an arbitration timing control operation from a main functional timing control operation for a dynamic memory controller, time can be more efficiently utilized. In the illustrated form, the timing controller allows a new cycle to be processed or arbitrated, and if a user requests another cycle, arbitration occurs during the present ongoing cycle. A cycle acknowledge signal is provided by feedback circuit 25 to indicate that the requested cycle is completed from a user's standpoint. When the arbitration for the next cycle is completed, a new cycle is ready to begin as soon as the present cycle is completed. When the new cycle begins, no time is dedicated to performing an arbitration since it occurred during the previous cycle.

By now it should be apparent that a memory refresh arbitration circuit which increases data throughput rates of a dynamic memory system while operating with a refresh signal that is asynchronous to a non-refresh memory cycle request has been provided. An arbitration delay has been eliminated by overlapping in time the arbitration associated with such a request with the execution of the previous memory cycle. The time overlapping is accomplished by using a delay line which is isolated from the main functional timing.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

We claim:

1. In a memory system having memory cycle generating circuity for performing predetermined memory cylces, a circuit for asynchronously arbitrating between refreshing memory of the memory system and performing a predetermined non-refresh memory cycle, comprising:
   arbitration means for asynchronously receiving either a refresh memory request signal or a non-refresh memory cycle request signal or both request signals during one of a plurality of successive memory cycles, and arbitrating, during a dedicated arbitration time frame of each of the plurality of successive memory cycles and simultaneous with a memory cycle operation, which signal to execute in an immediately successive memory cycle, thereby reducing the length of the immediately successive memory cycle.

2. The circuit of claim 1 wherein said arbitration means comprise:
   first logic means having first and second inputs for receiving the refresh memory cycle request signal and the non-refresh memory cycle request signal, respectively, and an output for selectively indicating the presence of either request signals;
   clocked storage means having a known settling time and a data input coupled to a predetermined one of the request signals, a clock input coupled to the output of the first logic means, and an output for providing an output control, signal for controlling whether the immediately successive second memory cycle is a refresh or a non-refresh memory function;
   first delay means having an input coupled to the output of the first logic means, and an output for providing a cycle initiate signal, said first delay means having a delay at least equal to the settling time of the clocked storage means;
   second logic means having an input coupled to the output of the first delay means, and an output for selectively indicating the presence of the cycle initiate signal;
   second delay means having an input coupled to the output of the second logic means, and an output for providing a plurality of delayed cycle signals, of which predetermined ones and combinations thereof correspond to a predetermined memory cycle function;
   first feedback means having predetermined inputs coupled to the output of the second logic means and to the output of the second delay means, for maintaining an active memory cycle and for reenabling the second logic means upon completion of the active memory cycle; and
   second feedback means having predetermined inputs coupled to the outputs of the second logic means and the second delay means, for enabling the first logic means to receive subsequent cycle request signals.

3. The circuit of claim 2 wherein said clocked storage means comprise a D-type flip flop circuit having a predetermined metastable characteristic.

4. The circuit of claim 2 wherein said first logic means comprise:
- a first AND gate having a first input connected to the data input of the clocked storage means for receiving the refresh memory request signal, a a second input and an output;
- a second AND gate having a first input for receiving the non-refresh memory cycle request signal, a second input connected to both the second input of the first AND gate and to the output of the second feedback means for periodically receiving an enable signal from the second feedback means, and an output;
- an OR gate having a first input connected to the output of the first AND gate, a second input connected to the output of the second AND gate, and an output connected to the clock input of the clocked storage means, for clocking the storage means in response to either or both the refresh request signal or the non-refresh request signal.

5. The circuit of claim 2 wherein said second logic means comprises:
- a first AND gate having a first input connected to the output of the first delay means, a second input connected to the output of the first feedback means, and an output;
- a second AND gate having a first input connected to the second input of the first AND gate, a second input and an output
- an OR gate having a first input connected to the output of the first AND gate a second input connected to the output of the second AND gate, and an output connected to the second input of the second AND for indicating the presence of the cycle initiate signal in response to the first feedback means, wherein the second AND gate latches the output of the OR gate in response to the first feedback means.

6. A method of arbitrating between performing a non-refresh memory cycle or a refresh memory cycle in a memory system having memory cycle generating circuitry, comprising the steps of:
- asynchronously receiving a non-refresh memory cycle request signal and a memory refresh request signal during one of a plurality of successive memory cycles of the memory system
- providing simultaneously with a memory cycle operation a dedicated arbitration time frame during each of the plurality of successive memory cycles and immediately before completion of each memory cycle;
- arbitrating whether to perform a non-refresh memory cycle or a refresh memory cycle in response to both request signals, and providing an arbitrated result signal; and
- performing either a non-refresh memory cycle or a refresh memory cycle during an immediately successive memory cycle in response to the result signal, wherein the length of the immediately successive memory cycle is reduced.

7. A circuit for asynchronously arbitrating during an arbitration time frame occurring during a first memory cycle between refreshing memory of a memory system or performing a predetermined memory cycle during a second memory cycle adjacent to the first memory cycle, said arbitration occurring in response to receiving either a non-refresh memory cycle request signal or a refresh memory cycle request signal, comprising:
- first logic means having first and second inputs for receiving the refresh memory cycle request signal and the non-refresh memory cycle request signal, respectively, and an output for selectively indicating the presence of either request signals;
- clocked storage means having a known metastable settling time and a data input coupled to a predetermined one of the request signals, a clock input coupled to the output of the first logic means, and an output for providing an output control signal for controlling whether the second memory cycle is a refresh or a non-refresh memory function;
- first delay means having an input coupled to the output of the first logic means, and an output for providing a cycle initiate signal, said first delay means having a delay at least equal to the metastable state settling time of the clocked storage means;
- second logic means having an input coupled to the output of the first delay means, and an output for selectively indicating the presence of the cycle initiate signal;
- second delay means having an input coupled to the output of the second logic means, and an output for providing a plurality of delayed cycle signals, of which predetermined ones and combinations thereof correspond to a predetermined memory cycle function;
- first feedback means having predetermined inputs coupled to the output of the second logic means and to the output of the second delay means, for maintaining an active memory cycle and for reenabling the second logic means upon completion of the active memory cycle; and
- second feedback means having predetermined inputs coupled to the outputs of the second logic means and the second delay means, for enabling the first logic means to receive subsequent cycle request signals.

* * * * *

UNITED STATES PATENT AND TRADEMARK OFFICE
CERTIFICATE OF CORRECTION

PATENT NO. : 4,578,782

DATED : March 25, 1986

INVENTOR(S) : Kraft et al

It is certified that error appears in the above-identified patent and that said Letters Patent is hereby corrected as shown below:

In the claims:

In claim 2, column 6, line 43, delete "second";

In claim 5, column 7, line 37, after "output" insert a semicolon;

In claim 5, column 7, line 39, after "gate" insert a comma; and

In claim 5, column 7, line 42, after "AND" insert --gate--.

Signed and Sealed this

First Day of July 1986

[SEAL]

Attest:

Attesting Officer

DONALD J. QUIGG

Commissioner of Patents and Trademarks